United States Patent [19]

Cavanagh et al.

[11] Patent Number: 4,567,645

[45] Date of Patent: Feb. 4, 1986

[54] METHOD FOR FORMING A BURIED SUBCOLLECTOR IN A SEMICONDUCTOR SUBSTRATE BY ION IMPLANTATION

[75] Inventors: Richard A. Cavanagh, Hopewell Junction; John L. Forneris, LaGrangeville; Gregory B. Forney; George Hrebin, Jr., both of Hopewell Junction; Ronald A. Knapp, Stormville, all of N.Y.

[73] Assignee: International Business Machines Corporation, Armonk, N.Y.

[21] Appl. No.: 533,016

[22] Filed: Sep. 16, 1983

[51] Int. Cl.$^4$ .................. H01L 21/263; H01L 21/265
[52] U.S. Cl. .................. 29/576 B; 148/1.5; 148/187; 357/34; 357/91
[58] Field of Search ............... 29/576 B; 148/1.5, 187; 357/34, 91

[56] References Cited

U.S. PATENT DOCUMENTS

| | | | |
|---|---|---|---|
| 3,895,965 | 7/1975 | MacRae et al. | 148/1.5 |
| 3,945,856 | 3/1976 | Koenig et al. | 148/1.5 |
| 4,149,905 | 4/1979 | Levinstein et al. | 148/1.5 |
| 4,329,773 | 5/1982 | Geipel, Jr. et al. | 29/571 |
| 4,386,968 | 6/1983 | Hinkel et al. | 148/1.5 |

OTHER PUBLICATIONS

Briska et al., IBM-TDB, 20 (1980) 644.
Brack et al., IBM-TDB, 26 (1983) 681.
Beyer et al., IBM-TDB, 19 (1977) 3051.
Mueller et al., IBM-TDB, 19 (1976) 865.

*Primary Examiner*—Upendra Roy
*Attorney, Agent, or Firm*—Robert E. Sandt

[57] ABSTRACT

The method is comprised of the following steps:
implanting arsenic ions through a thin screen oxide layer in the regions of a P type silicon substrate where subcollectors are to be formed, at a dose less than $2.10^{16}$at/cm$^2$, partially etching said screen oxide layer to remove the upper portion, containing contaminating ions exposing to an oxygen ambiant to approximately reconstitute original thickness of the screen oxide layer and then annealing in an inert atmosphere, the substrate, to heal damages and distribute arsenic atoms in the substrate. It has been discovered that the step of reconstituting the original thickness of the screen oxide layer in an oxygen ambient, has the unexpected effect of permitting the subsequent growth of an absolutely defect free epitaxial layer.

8 Claims, 9 Drawing Figures

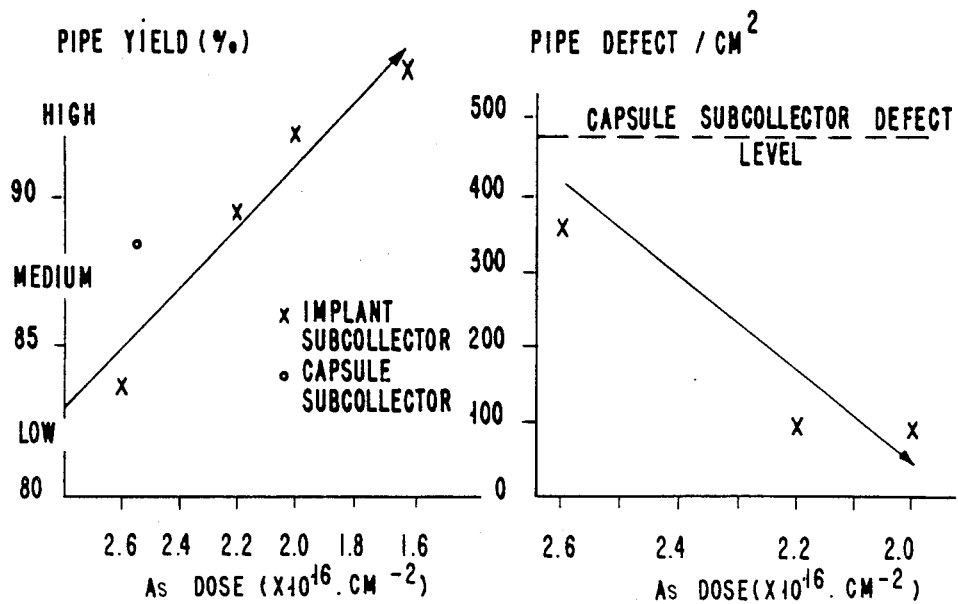
FIG. 2
FIG. 3
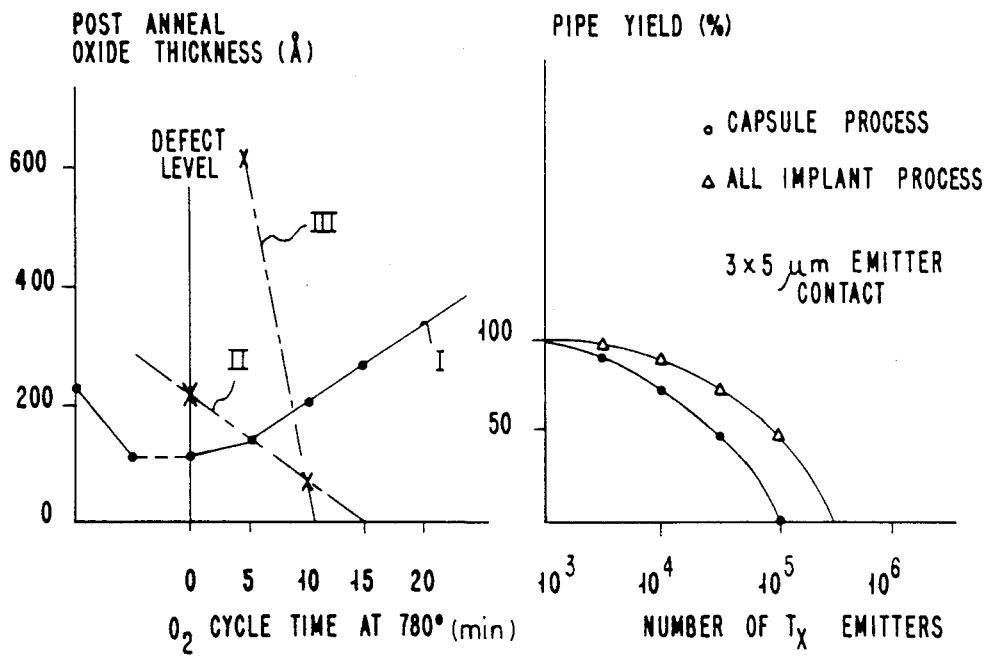
FIG. 4
FIG. 5

METHOD FOR FORMING A BURIED SUBCOLLECTOR IN A SEMICONDUCTOR SUBSTRATE BY ION IMPLANTATION

BACKGROUND OF THE INVENTION

1. Field of Invention

This invention relates to the formation of buried layers in semiconductor devices by means of ion implantation, and more specifically to the formation of arsenic implanted subcollectors in silicon devices.

The subcollector is a highly doped buried layer which has the effect of shunting the high resistivity collector region in a bipolar transistor, thereby reducing the series resistance significantly.

Several methods have been used so far for fabricating these subcollectors. The most known is the so-called "closed capsule diffusion". According to that technique the impurities such as Arsenic are diffused into an exposed region of a P type silicon substrate through a masking oxide layer to form a heavily doped N+ type low resistivity region known as being the "subcollector" of a bipolar transistor. Arsenic is widely used for that purpose because this region must remain localized during subsequent heat treatment steps. The impurity used must meet the two following requirements: have a low diffusion coefficient compared to that of other impurities such as boron and phosphorous currently used in the semiconductor device processing; and have a high solubility limit in order to dope silicon in excess of $10^{19}$ at/cm$^3$ and form the subcollector with the desired low resistivity.

After the step of forming the subcollector, the oxide masking layer is removed, and the N type collector is grown epitaxially on the substrate. The N+ subcollector is therefore sandwiched between the N type epitaxial layer and the P type substrate. Formation of base and emitter regions follows in a known manner.

Although the closed capsule process is well established today and is even considered as being pure routine, the development of new bipolar technologies where both emitter and base regions are formed according to ion implantation techniques, has created the need for fully implanted devices to receive benefit from the great advantages offered by ion implantation in terms of: dose control, profile flexibility, process automation, safety, etc. . . . as compared to diffusion.

One may expect significant advantages in replacing the closed capsule diffusion by ion implantation:

closed capsule process exhibits known disadvantages such as: capsule implosion due to evacuation and quenching, As powder contamination, backside coating of wafer, etc. . . .

closed capsule process is a higher temperature and longer process as compared to ion implantation. In addition, the high dose of arsenic near, to the solubility limit ($10^{21}$at/cm$^3$) which is necessary to form the subcollector in the closed capsule process, is replaced by a low dose (about $2\times 10^{16}$ at/cm$^2$) in the ion implantation process; the latter also presents the advantage of a higher degree of control.

However, the technology conversion from capsule to ion implantation is not without difficulties. Problems stem from compatibility issues with the capsule process relative to process operation and product performance. Competing with a process (closed capsule) that has matured to a high level of manufacturing stability presents a significant challenge to solve many difficulties.

A first difficulty to be surmounted comes from the fact that implanting impurities such as As at the high doses that are required for forming subcollectors, normally results in damages in the semiconductor crystal lattice. These damages are so severe that amorphous regions are produced which are not completely healed after the subsequent standard annealing step, leaving unacceptable residual crystallographic disorder.

Another difficulty comes from the current practice of implanting through a relatively thin passivating material, such as silicon dioxide, having a thickness of about 250 Å.

The advantages provided by the use of this thin, so called "screen layer", are well known; particularly, it acts as a cap; i.e. none of the silicon substrate is exposed at any point to contaminants in the ambient. However, contaminating ions are trapped in the screen layer. These contaminating ions, in a large part, result from collisions between the dopant ions (e.g. As) of the beam and the different parts (sidewalls, apertures, . . .) of the ion implantation equipment. During subsequent high temperature thermal steps such as diffusion and oxidation, those contaminating ions which have been trapped in the screen layer tend to diffuse into the substrate and then contaminate the implanted region.

2. Description of the Prior Art

There exists a very abundant literature relating to this subject, for example:

relating specifically to the problem of the formation of damaged regions.

U.S. Pat. No. 3,895,965, assigned to Bell Telephone Labs, discloses a method of forming buried layers by ion implantation, which includes removal of the damaged region of the semiconductor crystal resulting from such implants. Impurity ions are implanted near the surface of a silicon substrate. The substrate is then heated in an oxidizing ambient for a sufficient length of time to allow the impurities to diffuse further into the crystal while an oxide layer grows on the surface, consuming the damaged region. The oxide is removed leaving the impurities in defect-free material upon which may be grown an epitaxial layer. According to the teaching of this reference, the problem of contamination is not mentioned.

relating specifically to the problem of contamination

U.S. Pat. No. 3,945,856, assigned to International Business Machines, Inc., which discloses a method of ion implantation into a semiconductor substrate which comprises forming a layer of an electrically insulative material, such as silicon dioxide, on the substrate over the region to be ion implanted. Then, a beam of ions having sufficient energy to pass through the layer of insulative material and to penetrate into the substrate, is directed at a particular portion of the insulative layer. Before proceeding further, at least the upper half of the insulative layer, and preferably all of the upper portion of the insulative layer, in excess of a remaining thickness of 100 Å, is removed by etching. Then, the substrate is heated whereby the ions are driven further into the substrate to form the selected ion implanted region. This reference does not address at all, the problem of defects usually created in the epitaxial layer.

The above patent provides a general description of the process steps required for fabricating ion implanted arsenic subcollectors, however it does not provide the necessary details for this fabrication to occur on a level approaching "zero defects".

relating to both problems

IBM TDB Vol. 19 No. 3 August 1976, pp 865–865, an article entitled: "Forming Buried Subcollector by Ion Implantation", and, IBM TDB Vol. 19 No. 8 January 1977, pp 3051–3052, an article entitled: "Elimination of Stacking Faults" by K. D. Beyer et al; and, IBM TDB Vol. 20 No. 3 August 1977, pp 1003–1004, an article entitled: "Lower Defect Densities in Implanted As Subcollector Devices" by K. D. Beyer et al.

All these references address the problem of the formation of ion implanted subcollectors through a thin screen layer, while minimizing the number of defects such as stacking faults, pipes, etc. . . . which are inherent to the ion implantation process.

Maintaining a competitive edge in semiconductors requires the full solution of these problems before reaching all of the technical and economical advantages of ion implantation which have not yet been fully tapped: improved process yields, higher productivity and, most importantly, significant increases in end of line product yield which in turn result in a very favorable situation from a cost point of view.

It is, therefore, a first object of the present invention to replace the closed capsule subcollector process by an ion implanted process with a significant product yield improvement due to the full suppression while, still maintaining device performance.

It is another object of the present invention to provide a method for forming a buried subcollector in a semiconductor substrate by ion implantation without any contamination and damages in the implanted region.

A final and specific object of the invention is to provide an improvement in the method of forming a subcollector in a silicon semiconductor device by reconstituting the oxide screen layer which was partially etched away to remove the arsenic contaiminants caused by the ion implantation to thus provide a thickened oxide barrier to prevent out-diffusion of the arsenic during the subsequent annealing step.

SUMMARY OF THE INVENTION

These and others objects are achieved in accordance with the process of the present invention which, in one embodiment includes implanting arsenic ions through a thin screen oxide layer in the regions of a P type silicon substrate where subcollectors are to be formed, at a dose less than $2.10^{16} at/cm^2$, partially etching said screen oxide layer to remove the upper portion, containing contaminating ions exposing to an oxygen ambiant to approximately reconstitute original thickness of the screen oxide layer and then annealing in an inert atmosphere, the substrate, to heal damages and distribute arsenic atoms in the substrate. It has been discovered that the step of reconstituting the original thickness of the screen oxide layer in an oxygen ambient, has the unexpected effect of permitting the subsequent growth of an absolutely perfect epitaxial layer.

BRIEF DESCRIPTION OF THE DRAWINGS

These and others features of the invention are disclosed in detail in the description which follows and in the drawings in which:

FIG. 2 shows the pipe yield vs implant subcollector dose.

FIG. 3 shows the pipe defect density sensitivity to subcollector dose.

FIG. 4 shows the determining effect of $O_2$ cycle time during the anneal on the defect level.

FIG. 5 shows the pipe yield (Poisson's model) for a particular dimension of the emitter for both capsule and implant processes.

DETAILED DESCRIPTION OF THE PREFERRED EMBODIMENT

1. Process Description

The wafers are Boron doped P type silicon substrates having a <100> orientation and a resistivity of 10–20 ohm.cm.

The subcollector pattern etching operations preceding either the capsule or implanted subcollectors are identical with one exception: capsule diffusion wafers require that oxides on the back of the wafers not be removed during subcollector oxide etch because of autodoping concern created at epitaxial deposition. This device-side-down procedure, which can contribute significantly to non random defects, is not required for implanted subcollectors.

Figure 1A:
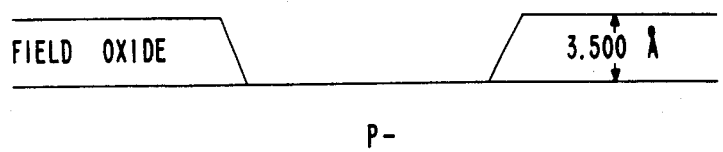
FIGS. 1A through 1E are cross sectional views of a silicon substrate at successive stages of manufacture according to preferred embodiment of the invention.

FIG. 1A shows the structure after the subcollector oxide etch. Thickness of the masking silicon dioxide or field oxide is about 3,500 Å. This particular step is not critical due to the large images involved and simplicity of the dielectric layer.

The successive wafers receive a Huang Clean operation, designed to remove both organic and metallic contaminants. The solutions utilized to accomplish this are dilute HF; ammonium hydroxide-hydrogen peroxide; and hydrochloric acid-hydrogen peroxide. This Huang clean aims to insure the absolute cleanliness very necessary for uniform oxide growth.

Screen Oxidation

The wafers are placed in an oxidation furnace at 780° C. in dry $O_2$. The furnace is ramped to 900° C. while 1% HCl flows through the system as an additional cleaning procedure. A nominal thickness of 225 Å is grown, at which point the furnace is ramped back down to 780° C.

The screen oxide layer serves four important functions:

1. protects silicon from sputtered contaminants,
2. immobilizes radiation induced damages,
3. randomizes ion direction to prevent crystallographie channelling,
4. helps prevent out diffusion of arsenic during the subcollector anneal and subsequent redistribution heat cycles.

Figure 1B:
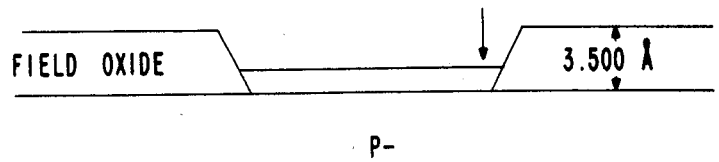

Precise control of the oxide layer thickness is a recommended requirement to insure the profile integrity of the implanted arsenic but is fundamental for implanting emitters where small deviations in oxide thicknesses produce wide variances in transistor device parameters when implanting at the energy as taught by the process according to the present invention. Resulting structure is shown in FIG. 1B.

Implantation

Wafers are exposed directly to the ion beam (energy 50 kev, dose $2/10^{16} at/cm^2$) without any masking material to delineate the subcollector regions. Masking is not required because the field oxide is sufficiently thick (3,500 Å) to prevent the penetration of 50 KeV As+ into the silicon.

The arsenic ions are implanted with beam currents of 0.5-5.0 mA in a beam offset 7° from the silicon surface normal <100>. Wafers are placed in a slotted groove on an Al disc.

The wafers are scanned across the beam by being spun on the disc that moves slowly in a vertical direction, causing the beam to move radially across the disc. The velocity of the vertical movement of the disc is attenuated by a factor of 1/r, where r is the radial position of the beam on the disc. This guarantees dose uniformity across the disc.

Figure 1C:
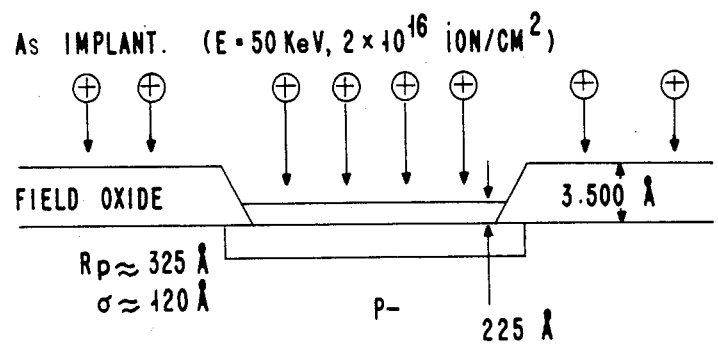

The resulting structure is shown in FIG. 1C. Implantation parameters are Rp=325 Å and $\delta$=120 Å.

The implant dose is set at $2.0 \times 10^{16}$ ions/cm$^2$: this value which appears to be the "yield optimized dose level" has been optimized to allow maximum yield, while still maintaining product performance. Lower doses have been shown to result in even higher product yields, but the effect of the significantly higher subcollector sheet resistivity on circuit performance has prevented its implementation on current products. More detailed data concerning this "yield optimized dose level" may be found thereafter, see subtitle: "pipe defect improvements with implanted subcollector" subtitle in conjunction with FIGS. 2 and 3.

Screen Oxide Partial Etch

Figure 1D:
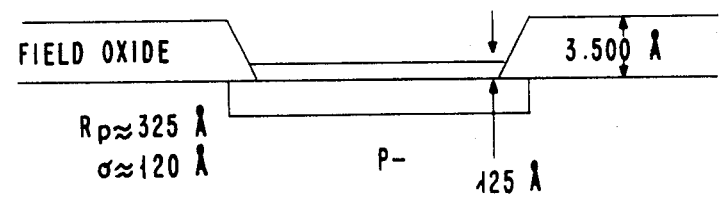

After implantation, the screen oxide layer is partially etched in a dilute HF solution, to remove contaminants such as any sputtered metallics that may have a deleterious effect on epitaxy quality. Approximately 100 Å of oxide are removed (FIG. 1D).

Implant Anneal

Screen oxide regrowth: the first portion of the implant subcollector anneal cycle exposes the wafers to an oxygen ambient at 780° C. in order to preserve the thickness integrity of the screen oxide cap that had been previously etched. The magnitude of oxide growth is therefore limited to approximately 100 Å. This is the key step of the present invention. It will be discussed further with more details in conjunction with FIG. 4.

Figure 1E:
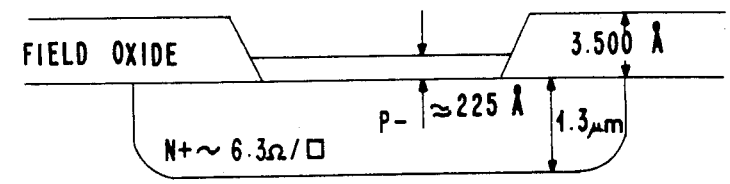

Redistribution: the remainder of the heat cycle is performed at 1100° C. in an Ar ambient for 90 minutes. Implant damage is annealed and the arsenic redistributed to a depth of $1.3\pm0.2\simeq$ and a Co$\mu$1-2$\times 10^{20}$ at/cm$^3$ (spreading resistance measurement). The resulting structure is shown in FIG. 1E.

Screen oxide etch: no subsequent process operation is modified to accomodate implanted subcollects except for epi. Due to the substantial decrease in arsenic pile-up at the silicon interface, relative to the capsule process, less autodoping occurs during epi growth. Consequently, the epi-layer is appropriately compensated to maintain device performance transparency with capsule product. A 5 minute etch in dilute HF is performed. For the purposes of:

thinning the field oxide to minimize etch bias at isolation pattern etching, and totally removing the screen oxide over the regions to be reoxidized.

Subcollector reoxidation: Implanted wafers receive the same 5000 Å reoxidation as seen by wafers built with the capsule subcollector process. Because thermal oxidation is somewhat enhanced in the implanted region, there will be a recess of a few hundreds Angstroems in depth coincident with the dimensions of the implanted region. This recess is well known in the art, and widely used as an indicator for alignment with respect to the buried subcollector during subsequent masking steps because it is visible through the transparent epitaxial layer.

2. Pipe defect improvements with implanted subcollectors.

relations between the "pipes" and the leakage limited yield (LLY)

Product yield is ultimately determined by a process ability to center device parametric distributions to optimum yield and performance nominals while minimizing semiconductor defects. For the most part, semiconductor bipolar defects manifest themselves electrically as excessive junction leakages. These leakage currents prohibit the normal operation of a device and circuit, limiting product yields. As a consequence, bipolar process engineers are keyed to monitoring and improving the leakage limited yield contribution of a process. The overall leakage limited yield of a transistor is a measure of the integrity of the leakage paths within a device: emitter to base, collector to base, and collector to emitter. The collector to emitter leakage path is the most significant detractor to LLY. The semiconductor defects that most often causes high collector to emitter leakages are referred to as "pipes". The control and reduction of pipes have been the object of intense engineering effort for many years in every bipolar manufacturing facility.

Parametrically, a pipe is detected with a BVceo test. Results of the test, to a minimum voltage criteria, are quoted in terms of BVceo or pipe yields. They manifest themselves electrically in an n-p-n transistor as narrow, high resistance N-type conduction path between the emitter and collector regions.

Pipes can eminate from either the emitter or subcollector regions. They are cause and influenced by many factors: wafer stress, deleterious contaminants, crystallographic imperfections, etc. They are randomly distributed.

It may be noticed that some of the following data, result from experiments conducted with transistors having both emitter and subcollector implanted.

The Role of the Dose as a Basic Parameter

The objective of initial experiments with the implanted subcollector process was to define the exact As dose that would make the process identical to the capsule relative to Rs. Consequently, various dose levels were iterated about a nominal value calculated to be equivalent to capsule Rs. Unexpectedly, a strong LLY sensitivity to dose levels was found, with the lower dose levels giving very high yields. This is illustrated in FIG. 2 showing yield results, as measured on a large transistor structure, for various implant doses and the capsule. Additional experiments comparing capsule and implant doses, run with product test sites, showed lower dose implants resulting in the lowest pipe defect density with a substantial improvement over capsule (FIG. 3). We were not able to determine significant physical differences between high and low dose implant wafers. Etch pit density was somewhat higher on the highest dose samples, but not sufficient to explain yield and defect differences. Nevertheless, the direction for the implant subcollector process was clear. In order to increase the yield potential of the implanted subcollector, the lowest possible dose level would be chosen. Unfortunately, from a yield perspective, we could only reduce our dose to $2 \times 10^{16}$ ions/cm$^2$ in order to maintain a guarantee of performance transparency to capsule product.

SIMS profiles on the implant subcollector process were compared to the standard capsule subcollector process, both before and subsequent to a 5000 Å subcollector reoxidation. Both profiles showed a 50% decrease in As surface pile-up for implant compared to capsule. Spreading resistance measurements showed a surface Co of 1 to $2 \times 10^{20}$ at/cm$^3$. Comparing this to the SIMS profiles implies a significantly larger amount of inactive arsenic for the capsule process. This suggests that inactive arsenic clustering may be contributing to the formation of crystallographic defects.

A recent experience tends to support the relationship between As pile-up and device defects. Process control problems with the epi-prebake had caused a low temperature excursion on a significant number of runs. This resulted in a catastrophic increase in pipes for capsule product. The ion implant product was unaffected. It was proposed that with the capsule process, the low temperature excursion prevented the normal vaporization of As pile-up, leading to clustering. But, the implant product is less sensitive to low temperature excursions since it has significantly less As and does not rely on As vaporization to reduce surface pile-up.

The degree of arsenic clustering may be the basis for the explanation of yield differences between low and high dose subcollector implants. However, contradiction to this model arise from two observations; one, no detectable difference in etch analysis between low and high dose implant wafers, and two, high dose wafers generally show higher yield than capsule controls.

If the lower yield for the capsule process is an artifact of excessive As pile-up at the silicon-oxide interface, an obvious alternative would be to lower the As concentration, increasing the capsule subcollector resistivity to the implant level. Results to date show a slight improvement for a lower source weight capsule process. However, the increase does not approach the levels attained by implant.

The Role of the Ion Implantation Current

Prompted by concerns as to the impact on LLY and product yield, a series of experiments evaluating the impact of beam current on defect generation was conducted. LLY and final test results showed no negative impact up to 4 mA.

The Role of the Screen Oxide Regrowth

Like U.S. Pat. No. 3,945,856 mentioned above which claims that a SiO$_2$ regrowth preceding the anneal heat cycle is necessary only for the capping of the implanted arsenic ions, and that is therefore not needed in the absence of a pre-anneal etch, the present method demonstrates that this growth is essential for defect annihilation and acceptable device yield. Also this regrowth must be performed regardless of whether there was a post implant etch (of all or half of the screen oxide) and must be done to a minimum thickness (about 225 Å) to guarantee acceptable device yield.

FIG. 4 shows the determining effect of the O$_2$ cycle time during the anneal on the defect level. Curve I shows evolution of the post anneal screen oxide thickness. Curves II and III represent the defect levels for two different ion implanters. It is clear that with an anneal time in the range of 10–15 min, the defect level is zero in any case. This approximately corresponds to a thickness close to the original screen oxide thickness.

FIG. 5 shows the BVceo limited yield as a function of chip circuit density (number of transistor emitters).

Both curves have been plotted with $3 \times 5$ microns emitter contacts.

It is now clear that the implant process has sufficiently reduced pipe density to allow manufacture of VLSI circuits with a higher probability for success.

Further improvements should be realized mainly through reductions in subcollector doses.

Combining Both Optimized Dose and Oxide Regrowth Feature

Combining both the optimized dose and the screen oxide regrowth results in a significant increase in yield as it may be understood from FIG. 5.

3. Conclusion

To summarize, the advantages of the present process relative to the closed capsule process and implant process as disclosed in the prior art are two fold:

Doping Control: the three sigma distribution for end of line subcollector sheet resistance is improved by 50% by utilization of the implanted subcollector process compared to the standard closed capsule process.

Different end of line sheet resistances are easily obtainable by variations in the arsenic implant dose (electronic control). This is a dramatic improvement in dopant control over the capsule process, wherein the quantity of arsenic dopant to be diffused is only determined by a mechanical source weight measurement.

Product Yield: substantial final test yield improvement has been observed with the present implant subcollector process, due to a drastic reduction of crystallographic defects resulting from both a significant decrease in arsenic pile-up and less arsenic clustering compared to closed capsule and prior implant processes. The present process has been reduced to practice and has demonstrated its value in the manufacturing of dense array products.

What is claimed is:

1. An improvement in the method of forming a buried subcollector device wherein a thick silicon dioxide masking layer having a predetermined pattern of openings is formed on a P-type silicon substrate, followed by the growing in said openings of thin silicon dioxide screen layer, through which a beam of arsenic ions having an energy of 50 KeV and a dose less than $2.2 \times 10^6$ at/cm$^2$ produces the buried subcollector area, and partially etching away said screen oxide layer to remove the contaminated upper layer, characterized by; heating the thus-produced device in an oxydizing atmosphere for a time and temperature sufficient to restore the screen oxide layer to approximately its pre-etched thickness, and annealing the device in an inert atmosphere for a time and temperature sufficient to heal and damages any redistribute the arsenic ions in said subcollector region.

2. The method according to claim 1 wherein said screen layer has thickness of 225 Å.

3. The method according to claim 2 wherein said partial etch removes about 100 Å.

4. The method according to claim 3 wherein said oxidizing ambient comprises dry oxygen.

5. The method according to claim 4 wherein the original thickness is preserved.

6. The method according to claim 5 wherein the substrate is heated at about 780° C. for at least 10 minutes.

7. The method according to claim 6 wherein the cycle time is about 15 minutes.

8. The method according to claim 7 wherein said inert atmosphere is Argon and the substrate is heated at about 1100° C. for about 90 minutes.

* * * * *